United States Patent [19]

Tamiya et al.

[11] Patent Number: 6,045,713
[45] Date of Patent: Apr. 4, 2000

[54] METHOD OF MANUFACTURING A 2-LAYERED FLEXIBLE SUBSTRATE

[75] Inventors: Yukihiro Tamiya, Niihama; Takehiko Sakurada, Ichikawa; Toshinobu Takabatake; Takashi Sugiura, both of Niihama, all of Japan

[73] Assignee: Sumitomo Metal Mining Co., Ltd., Tokyo, Japan

[21] Appl. No.: 08/970,210

[22] Filed: Nov. 14, 1997

[30] Foreign Application Priority Data

Jan. 9, 1997 [JP] Japan ..................................... 9-013430
Oct. 14, 1997 [JP] Japan ..................................... 9-296218

[51] Int. Cl.⁷ ........................................................ B22C 1/22
[52] U.S. Cl. .................................................. 216/13; 216/34
[58] Field of Search .................................. 216/13, 20, 33, 216/34; 427/96, 98

[56] References Cited

U.S. PATENT DOCUMENTS 5,721,007 2/1998 Lynch et al. ........................... 216/13 X
5,800,722 9/1998 Tsuyoshi et al. ..................... 216/20 X

*Primary Examiner*—William Powell
*Attorney, Agent, or Firm*—Watson, Cole, Grindle, Watson, P.L.L.C.

[57] ABSTRACT

A method of manufacturing a 2-layered flexible substrate includes forming an underlying metal layer on an insulation film with a deposition layer formed by a dry plating method using at least one of nickel, copper-nickel alloy, chromium and chromium oxide and a copper deposition layer formed by a dry plating method on the noted deposition layer, then forming a primary electric copper plated deposition layer on the underlying metal layer, then applying a treatment using at least one alkaline solution selected from inorganic alkaline solutions and organic alkaline solutions, then forming an electroless copper plated deposition layer as an intermediate metal layer on the primary electric copper plated deposition layer and, finally, forming a secondary electric copper plated deposition layer on the intermediate metal layer, thereby finally forming a copper conductor layer of 1 to 35 $\mu$m thickness on the insulation film.

13 Claims, No Drawings

METHOD OF MANUFACTURING A 2-LAYERED FLEXIBLE SUBSTRATE

BACKGROUND OF THE INVENTION

1. Field of the Invention

The present invention concerns a method of manufacturing a 2-layered flexible substrate and, more specifically, it relates to a method of manufacturing a 2-layered flexible substrate capable of easily forming a copper conductor layer of more intact and adhesive property upon forming a copper conductor layer on an insulation film by adopting a dry plating method, an electroless plating method and an electric copper plating method.

2. Statement of the Prior Art

Substrates used for manufacturing flexible wiring boards are generally classified into a 3-layered flexible substrate in which a copper foil as a conductor layer is appended on an insulation film by using an adhesive and a 2-layered flexible substrate in which a copper conductor layer is formed directly on an insulation film without using an adhesive by a dry plating method or a wet plating method.

In a case of using the 3-layered flexible substrate, a 3-layered flexible wiring board can be manufactured by forming a desired wiring pattern on the substrate by a subtractive method. In the case of using the 2-layered flexible substrate, a 2-layered flexible wiring board can be manufactured by forming a desired wiring pattern on the substrate by a subtractive method or an additive method. Generally, use of the 3-layered flexible substrate which employs simple manufacturing method and can be manufactured at a reduced cost has been predominant.

By the way, along with the increasing density of electronic equipments in recent years, narrower pitch has been demanded for the width of wirings in wiring boards. However, upon manufacturing wiring boards, when wiring portions are formed by etching a copper conductor layer formed on an insulation film of a substrate in accordance with a desired wiring pattern, since a so-called side etching is caused in which the lateral side of the wiring portion is etched, the wiring portion tends to have a diverging trapezoidal cross sectional shape. Accordingly, since the width of the wiring pitch is excessively large, if etching is conducted till electric insulation is ensured between the wiring portions, there is a limit for narrowing the pitch for the width of the wiring portions in the wiring board in the use of a generally employed 3-layered flexible substrate in which a copper foil of 35 μm thickness used generally is appended.

In view of the above, it has been attempted to use a substrate in which a thin copper foil of 18 μm or less is appended instead of a conventional substrate in which a copper foil of 35 μm thickness is appended, thereby decreasing the diverging width caused by the side etching to narrow the pitch in the wiring portion of a wiring board. However, since the copper foil of such a reduced thickness has less rigidity and poor handlability, it has been adopted a method of once appending a reinforcing material such as an aluminum carrier to the copper foil to increase the rigidity, then appending the copper foil and the insulation film and then removing the aluminum carrier. However, this method involves a problem of taking much labor and time and is poor in the operation efficiency.

Further, such a thin copper foil also involves a problem in view of manufacturing techniques that defects of film are increased due to scattering of the film thickness, pin holes or occurrence of crackings. Further, as the thickness of the copper foil is decreased, manufacturing thereof becomes more difficult, which increases the manufacturing cost to lose the economical merit of the 3-layered flexible wiring boards because of increase in the manufacturing cost. Particularly, since it has been an increasing demand recently for a wiring board having a wiring portions with such a narrow width and a narrow pitch that can not be manufactured unless a copper foil having a thickness of less than ten and several micrometers, for example, about of several micrometers, the wiring board using the 3-layered flexible substrate involves problems in view of the manufacturing cost as well as the technical problems described above.

Then, it has been noted a 2-layered flexible wiring board using a 2-layered flexible substrate capable of forming a copper deposition layer on an insulation film directly without applying an adhesive. The 2-layered flexible substrate has a copper conductor layer formed directly on the insulation film without an adhesive and, accordingly has a merit capable of reducing the thickness of the substrate itself and can optionally control the thickness of the copper conductor to be deposited. Then, when such a 2-layered flexible substrate is manufactured, electric copper plating is usually adopted as a means for forming an inexpensive copper conductor layer of a uniform thickness on the insulation film and, generally, a thin underlying metal layer is formed on the insulation film to be applied with an electric copper plated layer to provide the entire surface with electroconductivity, on which electric copper plating is applied.

By the way, the thin underlying metal layer is usually formed on the insulation film by using a dry plating method such as vacuum deposition or ion plating but since a lot of pin holes in the size of from several tens micrometers—several hundreds micrometers are usually formed on the deposited layer obtained by the dry plating method, exposed portions of the insulation film caused by pin holes are often formed on the underlying metal layer.

Heretofore, in the flexible wiring board of this type, it has been considered generally that the thickness of the deposited conductive copper layer required for wirings is appropriately from 35 μm to 50 μm, but since the width of the wirings to be formed is also about several hundred micrometers, defects of the wiring portion induced by the presence of the pinholes of several tens micrometers are scarcely caused.

However, in a case of obtaining a flexible wiring board having a wiring portion of such a narrow pitch as intended in the present invention, it is preferred that the thickness of the deposited layer copper for forming the wiring portion is desirably as thin as possible, namely, less than 35 μm, preferably, less than 18 μm and, most preferably, about 5 μm as described above, so that possibility of causing defects in the wiring portion is increased.

Referring to the above-mentioned situation for a case of manufacturing a 2-layered flexible wiring board, for example, by a subtractive method, using a 2-layered flexible substrate in which a copper conductor layer of a desired thickness is formed on an insulation film formed with an underlying metal layer, the wiring portion is patterned is formed by the following steps.

(1) A resist layer having such a desired wiring pattern that only the wiring portion is masked and a copper conductor layer is exposed at a not-wiring portion is disposed on the copper conductor layer.

(2) The exposed copper conductor layer is removed by chemical etching.

(3) Finally, the resist layer is removed.

Accordingly, in a case of using a substrate in which the thickness of the copper conductor layer is formed, for example, as thin as 5 µm, for and manufacturing a wiring board having a narrow wiring width and a narrow wiring pitch, for example, a wiring width of 40 µm and a wiring pitch of 80 µm, the size of large pinholes among pinholes formed in the underlying metal layer of the substrate by the dry plating, reaches the order as large as several tens micrometers to several hundreds micrometers, so that the exposed portion of the insulation film induced by the pinholes cannot be buried scarcely when the electric copper plated deposition layer of about 5 µm thickness is formed and, accordingly, the exposed portion, namely, the defective portion of the conductor layer interferes the wiring portion and the wiring portion is depleted at the position of the pinhole to cause wiring defects or, if not, lead to adhesive failure of the wiring portion.

As a method of solving the foregoing problem, a method has been proposed of forming an underlying metal layer on an insulation film by a dry plating method, and then further applying a deposited copper layer as an intermediate metal layer by electroless plating, thereby covering the exposed portion of the insulation film induced by pinholes. However, although the exposed portion of the insulation film induced by the pinholes can be eliminated to some extent by this method, a plating solution used for the electroless copper plating or a pretreatment solution theref or penetrates through already formed pinholes of various sizes to a position between the insulation film and the underlying metal film, which brings about hindrance for the adhesion of the underlying metal layer and, thus, the adhesion of the conductor layer by electric plating to be formed subsequently, and this method cannot provide a satisfactory countermeasure.

OBJECT OF THE INVENTION

An object o f the present invention is to overcome the foregoing problems in the manufacture of a flexible wiring board by using a dry plating method, an electroless plating method and an electric plating method and provide a method of manufacturing a flexible wiring board which is free from depletion of a copper conductor portion induced by pinholes caused upon forming an underlying metal layer on an insulation film by a dry plating me thod and which is excellent in adhesion between the insulation film and the underlying metal layer.

SUMMARY OF THE INVENTION

The present invention for attaining the foregoing object provides a method of manufacturing a 2-layered flexible substrate by forming an underlying metal layer on at least one surface of an insulation film directly not by way of an adhesive and forming a copper conductor layer of a desired thickness on the underlying metal layer, the method comprising:

forming an underlying metal layer on an insulation film with a deposition layer formed by a dry plating method using at least one material selected from the group consisting of nickel, copper-nickel alloy, chromium and chromium oxide and a copper deposition layer formed by a dry plating method on the above-mentioned deposition layer, then forming a primary electric copper plated deposition layer on the underlying metal layer, then applying a treatment using at least one alkaline solution selected from the group consisting of inorganic alkaline solutions and organic alkaline solutions, then forming an electroless copper plated deposition layer as an intermediate metal layer on the primary electric copper plated deposition layer and, finally, forming a secondary electric copper plated deposition layer on the intermediate metal layer, thereby finally forming a copper conductor layer of 1 to 35 µm thickness on the insulation film.

In the present invention, the thickness of the primary electric copper plated deposition layer applied on the underlying metal layer is preferably within a range from 0.3 to 10 µm and, particularly, 0.5 to 2 µm. Further, when an inorganic alkaline solution is used for the treatment with the alkaline solution to be applied after the formation of the primary electric copper plated deposition layer, the treatment is applied preferably by an aqueous solution of potassium hydroxide, sodium hydroxide or a mixture thereof. The concentration is preferably from 0.05 to 3.0 mol/liter. Further, in a case of using an organic alkaline solution, the treatment is preferably applied with a mixed solution of hydrazine and ethylenediamine in which the concentrations of hydrazine and ethylenediamine are preferably from 0.5 to 4.0 mol/liter and 0.5 to 2.0 mol/liter, respectively. Further, when a mixed solution comprising an inorganic alkaline solution and an organic alkaline solution is used, the treatment is preferably applied with a mixed solution of an aqueous potassium hydroxide solution and/or aqueous sodium hydroxide solution and hydrazine, and the concentrations of the inorganic aqueous alkaline solution and hydrazine are preferably from 0.05 to 3.0 mol/liter and 0.5 to 4.0 mol/liter, respectively.

The thickness of the electroless copper plated deposition layer is preferably from 0.01 to 1.0 µm and, when the electroless copper plated deposition layer is formed, a catalyzing treatment is preferably applied as a pretreatment. A secondary electric copper plated deposition layer is formed on the electroless copper plated deposition layer in the same manner as the primary electric copper plated deposition layer.

Then, it is necessary that the thickness of the copper conductor layer comprising the primary electric copper plated deposition layer, the electroless copper plated deposition layer and the secondary electric copper plated deposition layer is from 1 to 35 µm.

Further, in the present invention, for the 2-layered underlying metal layer formed directly on the insulation film by the dry plating deposition method, the thickness of the deposition layer obtained by applying a dry plating treatment to at least one material selected from nickel, copper-nickel alloy, chromium and chromium oxide is preferably from 50 to 2000 Å and the thickness of dry plated copper deposition layer formed thereon is preferably from 200 to 1000 Å. Further, one of vacuum vapor deposition, sputtering or ion plating is preferably adopted for the dry plating method for forming the underlying metal layer.

PREFERRED EMBODIMENTS OF THE INVENTION

As described above, the present invention provides a method of manufacturing a 2-layered flexible substrate comprises at first forming a primary electric copper plated deposition layer to a predetermined thickness on an underlying metal layer comprising two layers of a deposition layer formed by using at least one material selected from the group consisting of nickel, copper-nickel alloy, chromium and chromium oxide by a dry plating method and a copper deposition layer formed further on the deposition layer by a dry plating method on an insulation film, applying a treatment them with an alkaline solution, then depositing an electroless copper plated deposition layer further on the primary electric copper plated deposition layer, and forming a secondary electric copper plated deposition layer, thereby finally forming a copper conductor layer of a desired thickness, whereby a 2-layered flexible substrate with less defects in the conductor portion induced by pinholes caused in the dry plating and having high adhesion between the conductor layer and the insulation film can be obtained successively by adopting the manufacturing method according to the present invention, when a flexible wiring board is manufactured by using a dry plating method, an electroless plating method and an electric plating method.

The reason why the electric copper plated deposition layer is formed divisionally as primary and secondary layers on the substrate is to be explained below. That is, a number of pinholes of various sizes are present in a plated deposition layer formed on an insulation film by a usual dry plating method in which most of them are minute pinholes of smaller than 1 $\mu$m, which are difficult to be observed by an optical microscope and the others are large pinholes of several to several hundreds micrometers. Then, the former minute pinholes scarcely give an effect on the occurrence of defects in wiring portions upon manufacturing a wiring board, but the latter large pinholes form exposed portions of a considerable size on the insulation film, so that unless the exposed portions are covered with the electroless copper plating step, the conductor layer formed in the subsequent electric copper plating step suffers from partial depletion, leading to wiring defects in the manufacture of the wiring board.

According to the experiment conducted by the present inventors, since an allowable limit for the depletion of the wiring portion in the wiring board is about ¼ to ⅓ of the wiring width, if a lot of pinhole-induced partial depletions in excess of 10 $\mu$m exit in the conductor layer formed to the substrate, for example, in a wiring board of 40 $\mu$m wiring width, it has been proved that the wiring boards manufactured by such a substrate tend to be failed.

Further, it has been also found that presence of the minute pinholes, among the above-mentioned pinholes, also brings about hindrance to the adhesion of the underlying metal layer since an electroless plating solution or a pretreatment liquid therefore penetrates through apertures of the minute pinholes to a portion between the underlying metal layer and the insulation film upon subsequent electroless copper plating and this undesirably reduces the adhesion strength of the wiring portion in the wiring board to be manufactured to less than 1 kgf/cm which is a value usually defined as a practical standard in the wiring board of this type. In view of the above, in the present invention, the primary electric copper plating is applied on the underlying metal layer, whereby the apertures of the minute pinholes in the underlying metal layer are buried by the thus formed copper plated deposition layer, to suppress the penetration of the electroless plating solution or the pre-treatment solution through the minute pinholes to the insulation film in the succeeding electroless copper plating step thereby ensuring the adhesion of the underlying metal layer to the insulation film.

The reason why the thickness of the primary electric copper plated deposition layer is defined within a range from 0.3 to 10 $\mu$m in this case is as described below. In the portion of large pinholes, since the surface of the insulation film is exposed largely, even if the electric copper plating is applied no copper plated deposition layer is formed on the insulation film with no electroconductivity. As a result, the thickness for the portion formed with the primary electric copper plated deposition layer is the sum of the thickness of the underlying metal layer and the thickness of the primary electric copper plated deposition layer, a step is formed between the exposed portion of the insulation film caused by the large pinholes and the portion formed with the primary electric copper plated deposition layer. Since the step remains as it is after the formation of the secondary electric copper plated deposition layer in the final step, if the thickness of the primary electric copper plated deposition layer is in excess of 10 $\mu$m, the step at the surface of the obtained 2-layer flexible substrate is too large and results in troubles in the fabrication for the wiring portion in the subsequent wiring forming step. On the contrary, if the thickness of the primary electric copper plated deposition layer is less than 0.3 $\mu$m, since apertures of the minute pinholes cannot be buried completely, penetration of the plating solution or the like tends to occur upon electroless copper plating, to bring about a worry of reducing the adhesion of the underlying metal layer, so that none of the cases is desired.

The thickness of the primary electric copper plated deposition layer may be to such a level as capable of burying the apertures of the minute pinholes and preventing the penetration of the plating solution, and the thickness is determined in view of the final thickness of the conductor layer obtained by applying the secondary electric copper plating and the size of the wiring width and the wiring pitch in the wiring portion formed to the wiring board. For instance, when the thickness of the conductor layer formed finally to the substrate is about 5 $\mu$m, the wiring width is about 40 $\mu$m and the wiring pitch is about 80 $\mu$m in the wiring board to be manufactured therewith, the thickness of the primary electric copper plated deposition layer is most suitably determined within a range from 0.5 to 2 $\mu$m in order to solve the substantial step while ensuring the adhesion of the underlying metal layer in the substrate.

In the present invention, a treatment with an alkaline solution is applied after the primary electric copper plating, because the exposed portion of the insulation film caused by the large pinholes are still left even after forming the primary electric copper plated deposition layer and it is difficult to effectively apply the catalyzing treatment as a pre-treatment to the electroless copper plating in the succeeding step on the exposed portion of the insulation film, so that the exposed portion of the insulation film is made hydrophilic by the alkaline solution to facilitate the catalyzing treatment thereby enabling to conduct the electroless copper plating smoothly and reliably. The alkaline solution used in this case may be any of inorganic alkaline solutions, organic alkaline solutions or mixed solutions of inorganic alkaline solutions and organic alkaline solutions so long as this can made the surface of the insulation film hydrophilic.

Then, the electroless copper plating is applied, for forming an electroless copper plated deposition layer over the entire surface of a substrate and, covering the exposed surface of the insulation film caused by the large pinholes to render the entire surface of the substrate highly electroconductive thereby enabling to apply the secondary electric copper plating in the succeeding step over the entire surface of the substrate with no effect of the pinholes. When the electroless copper plating is applied, it is preferred to previously apply a catalyzing treatment on the substrate by using a known catalyzing agent. Subsequently, a copper deposition is formed on the electroless copper plated deposition layer such that a conductor layer of a desired thickness is finally formed thereon by applying the secondary electric copper plating, whereby an intact 2-layered flexible substrate having a thin-walled conductor layer of about 1 to 35 $\mu$m can be obtained easily.

Species of catalyst metals used in the catalyzing treatment applied upon electroless copper plating may be any material so long as it is more novel in view of the potential than complexed metal ion species contained in an electroless plating solution and gold, platinum, silver, palladium can be used, for example. However, in view of the convenience, palladium series catalyzing agents commercially sold generally as the catalyzing agents, for example, an acidic palladium-tin solution, an alkaline palladium complex solution or a tin-free acidic palladium solution is appropriate. There is no particular restriction on the catalyzing method and a sensitizing activation method or a catalyst accelerator method which is generally adopted in the catalyzing treatment of this kind may be selected appropriately depending on situation.

Further, there is no particular restriction on the pretreatment upon catalyzing treatment but it is desirable to previously apply a cleaning treatment such as degreasing for improving the adhesion between the underlying metal layer and the insulation film and between the underlying metal layer and the electroless plated deposition layer. However, it should be strictly avoided to apply a treatment under such a condition that the copper deposition layer formed as the second layer of the underlying metal layer or the copper deposition layer formed by the primary electric plating is dissolved by the pre-treatment.

Further, any of electroless plating solutions may be used in the present invention so long the solution is of a reduction deposition type containing self-catalyzing metal ions which are reduced by a reducing agent such as hydrazine, sodium phosphinate and formalin to precipitate metals, and an electroless copper plating solution of good conductivity and relatively good operation efficiency is optimum, in view of the gist of the invention, since the primary object is to render the exposed portion of the insulation film exposed by the pinholes formed in the underlying metal layer to highly electroconductive.

The thickness of the plated deposition layer by the electroless copper plating solution may be such a thickness as capable of restoring defects in the substrate surface induced by the pinholes and not dissolved by the electric copper plating solution upon applying the electric copper plating and it is preferably within a range from 0.01 to 1.0 µm.

By finally applying the secondary copper plating so as to finally form a conductor layer of a desired thickness, to a substrate formed with electroless copper plated deposition layer, a 2-layered flexible substrate can be obtained, which is intact and has high adhesion of the conductor layer and free from the effect of pinholes of various sizes formed upon forming the underlying metal layer. For both of the primary and secondary electric copper plating treatments applied in the present invention, conditions in customary electric copper plating may be adopted.

It is necessary that the entire thickness comprising the primary electric copper plated deposition layer, the electroless copper plated deposition layer and the secondary electric copper plated deposition layer formed on the underlying metal layer is from 1 to 35 µm. If the entire thickness is less than 1 µm, the mechanical strength required for the copper conductor layer is not sufficient and, on the other hand, if it exceeds 35 µm, it results in a trouble for narrowing the pitch in the wiring portion.

Further, in the present invention, the underlying metal layer formed directly on the insulation film has a 2-layered structure comprising a first layer of a dry plated deposition layer obtained from at least one of materials selected from the group consisting of nickel, copper-nickel alloy, chromium and chromium oxide and a dry copper plated deposition layer formed thereon as a second layer. The underlying metal layer is formed as the 2-layer, in order for suppressing the foregoing troubles caused by the pinholes as less as possible by displacing the positions for the occurrence of pinholes caused by the dry plating treatment and improving both the adhesion and the conductivity of the underlying metal layer by disposing the dry plated deposition layer formed, for example, of nickel, chromium and a compound thereof having relatively good adhesion with a synthetic resin, namely, a constituent material of the insulation film as the first layer, and disposing a copper deposition layer of high conductivity to the surface layer as the second layer of the underlying metal layer, thereby facilitating the primary electric copper plating to be applied subsequently.

The thickness of each of the dry plating deposition layers formed as the underlying metal layer is preferably from 50 to 2000 Å for the dry plated deposition layer formed, of nickel, copper-nickel alloy, chromium or chromium-oxide and, preferably, from 200 to 5000 Å for the copper dry plated deposition layer for the second layer. If the thickness of the dry plated deposition layer of the first layer is less than 50 Å, this results in a trouble for the adhesion of the underlying metal layer with lapse of long time even if each of subsequent treatment steps is applied. On the contrary, if the thickness exceeds 2000 Å, it is difficult to remove nickel or chromium upon fabrication for the wiring portion and cracking or warp may be caused to deteriorate the adhesion strength, Further, if the thickness of the dry copper plated deposition layer as the second layer is less than 200 Å, the defects of reducing the pinhole-induced effects is decreased and conduction failure may possibly be caused in the electric plating. Further, if the thickness exceeds 5000 Å, cracking or warp may be caused due to stresses to the deposition layer to rather lower the adhesion strength undesirably.

Further, for the dry plating method for forming the 2-layered underlying metal layer in the present invention, any of vacuum vapor deposition, sputtering or ion plating may be adopted optionally.

EXAMPLE

The present invention is to be explained with reference to examples and comparative examples.

Example 1

A polyimide film of 50 µm thickness (manufactured by Toray · Dupon Co.; product name [Kapton 200 V]) was cut into 12 cm×12 cm size, a nickel deposition layer was formed to a thickness of 100 Å by vacuum deposition on one surface as a first layer of an underlying metal layer, and a copper deposition layer was formed further thereon as a second layer to a thickness of 1,000 Å by vacuum deposition.

Then, the film was immersed in a weekly alkaline degreasing agent for 1 min, and successively cleaned for 2 min to apply a surface cleaning treatment. Then, a primary electric copper plated deposition layer of 1 µm thickness was formed by using an electric copper plating solution of a composition shown in Table 1. The plating was applied under the conditions of a plating temperature at room temperature, with air stirring and at a current density of 0.5 A/dm$^2$.

TABLE 1

| | |
|---|---|
| Copper sulfate penta-hydrate salt: | 80 g/liter |
| Sulfuric acid: | 200 g/liter |
| Brightener: | optional amount |
| Chlorine ions: | 50 mg/liter |

After forming the primary electric copper plated deposition layer, it was washed with water, immersed in an aqueous solution of potassium hydroxide at a concentration of 0.05 mol/liter to render the surface of the polyimide film exposed by pinholes caused upon dry plating hydrophilic, washed with water and then immersed in a catalyzing solution and an accelerating solution (both manufactured by Okuno pharmaceutical Co.) to provide a catalyst on the surface of a substrate. Successively, the substrate was immersed in an electroless copper plating solution of a composition shown in Table 2 for 3 min to form an electroless copper plating deposition layer of 0.1 $\mu$m thickness on the surface. The plating was applied under the conditions at a plating solution temperature of 60° C., pH at 12.5 and with air stirring.

TABLE 2

| | |
|---|---|
| Copper sulfate: | 10 g/liter |
| EDTA: | 30 g/liter |
| HCHO (36% solution): | 5 ml/liter |
| PEG 1000: | 0.5 g/liter |
| Dipyridyl: | 100 mg/liter |

After the electroless copper plating, a secondary electric copper plated deposition layer was formed to a final thickness of a copper conductor layer of 5 $\mu$m by using an electric copper plating solution of a composition shown in Table 1. The plating was applied under the conditions at a plating solution temperature of room temperature, with air stirring and at a current density upon current supply of 3 A/dm$^2$.

When presence or absence of defects induced by pinholes was confirmed by applying light to the thus obtained substrate on the side of the copper conductor layer, no light permeation was recognized within a range of 12 cm×12 cm area to find that pinhole-induced defects was not present. When a flexible wiring board having a 40 $\mu$m wiring width and a 80 $\mu$m wiring pitch was manufactured by using the substrate based on a customary subtractive method, 2-layered flexible wiring board free from pinhole-induced defects in the wiring portion was obtained.

Further, when the wiring portion of the 2-wired flexible wiring board was peeled off vertically and the adhesion strength of the wiring portion was measured, it was found that the strength was not less than 1 kgf/cm$^2$ and had a higher adhesion strength as compared with the wiring board with the substrate formed by vapor depositing an underlying metal layer to a polyimide film, then applying electroless plating directly without applying the primary electric copper plated deposition layer, and then forming the electric copper plated deposition layer, and had an adhesion strength enough to be served for practical use.

This example shows an example of manufacturing a one-sided flexible wiring board obtained from a substrate having a wiring pattern on one surface of a polyimide by a subtractive method. However, it has been confirmed that similar excellent results can be obtained also for both-sided flexible wiring board having wiring portions on both surfaces of the insulation film, or one sided or both sided flexible wiring board manufactured by a semi-additive method.

Example 2

When a 2-layered flexible substrate was manufactured in the same procedures as those in Example 1 except for forming the primary electric copper plated deposition layer to a thickness of 0.5 $\mu$m and a 2-layered flexible wiring board was manufactured by using the substrate in the same procedures as in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 3

When a 2-layered flexible substrate was manufactured in the same procedures as those in Example 1 except for using potassium hydroxide at a concentration of 3.0 mol/liter for the hydrophilic treatment of the exposed portion of the polyimide film and a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 4

When a 2-layered flexible substrate was manufactured in the same procedures as those in Example 1 except for using an organic alkaline solution comprising a mixed solution of a hydrazine solution at a concentration of 0.5 mol/liter and an ethylene diamine solution at a concentration of 0.5 mol/liter for the hydrophilic treatment of the exposed portion of the polyimide film, and making the thickness of the primary electric copper plated deposition layer to 0.5 $\mu$m and the thickness of the electroless copper plated deposition layer to 0.5 $\mu$m, and a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 5

When a 2-layered flexible substrate was manufactured in the same procedures as those in Example 3 except for forming a copper-nickel alloy deposition layer to a thickness of 100 Å by vacuum deposition as the first layer of the underlying metal layer, and forming a copper deposition layer of 1,000 Å thickness as the second layer of the underlying metal layer by vacuum vapor deposition, a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 6

When a 2-layered flexible substrate was manufactured in the same procedures as those in Example 5 except for using an organic alkaline solution comprising a mixed solution of a hydrazine solution at a concentration of 0.5 mol/liter and an ethylene diamine solution at a concentration of 0.5 mol/liter for the hydrophilic treatment of the exposed portion of the polyimide film, a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 7

When a 2-layered flexible substrate was manufactured in the same procedures as those in Example 3 except for forming a chromium deposition layer to a thickness of 100 Å by vacuum deposition as the first layer of the underlying metal layer, and forming a copper deposition layer of 1,000 Å thickness as the second layer of the underlying metal layer by vacuum vapor deposition, and a 2-layered flexible wiring board was manufactured by using the substrate by the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 8

When a 2-layered flexible substrate was manufactured in the same procedures as those in Example 7 except for using an organic alkaline solution comprising a mixed solution of a hydrazine solution at a concentration of 0.5 mol/liter and an ethylene diamine solution at a concentration of 0.5 mol/liter for the hydrophilic treatment of the exposed portion of the polyimide film, a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 9

When a 2-layered flexible substrate was manufactured in the same procedures as those in Example 3 except for forming a chromium oxide deposition layer to a thickness of 100 Å by vacuum deposition as the first layer of the underlying metal layer, and forming a copper deposition layer of 1,000 Å thickness as the second layer of the underlying metal layer by vacuum vapor deposition, and a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 10

When a 2-layered flexible substrate was manufactured in the same procedures as those in Example 9 except for using an organic alkaline solution comprising a mixed solution of a hydrazine solution at a concentration of 0.5 mol/liter and an ethylene diamine solution at a concentration of 0.5 mol/liter for the hydrophilic treatment of the exposed portion of the polyimide film, a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 11

When a 2-layered flexible substrate was manufactured in the same procedures as those in Example 1 except for forming a nickel deposition layer of 100 Å thickness by vacuum deposition as the first layer of the underlying metal layer and forming a copper deposition layer of 1500 Å thickness by vacuum deposition as the second layer of the underlying metal layer, and using an inorganic/organic alkaline solution comprising a mixed solution of a potassium hydroxide at a concentration of 2.0 mol/liter and an hydrazine solution at a concentration of 2.0 mol/liter for the hydrophilic treatment of the exposed portion of the polyimide and a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 12

When a 2-layered flexible substrate was manufactured in the same procedures as those in Example 11 except for forming a chromium oxide deposition layer to a thickness of 50 Å by layer, and forming a copper deposition layer to a thickness of 1,500 Å by vacuum vapor deposition as the second layer, and a 2-layered flexible wiring board was manufactured by using the substrate in the same procedures as those in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 13

When a 2-layered flexible substrate was manufactured in the same procedures as those in Example 1 except for forming the primary electric copper plated deposition layer to a thickness of 8 μm, forming the electroless copper plated deposition layer to a thickness of 0.9 μm and forming the secondary electric copper plated deposition layer such that the final thickness of the copper conductor layer was 18 μm, and a 2-layered flexible wiring board was manufactured by using the substrate in the same procedures as in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Example 14

When a 2-layered flexible substrate was manufactured in the same procedures as those in Example 1 except for forming the primary electric copper plated deposition layer to a thickness of 10 μm, forming the electroless copper plated deposition layer to a thickness of 1.0 μm and forming the secondary electric copper plated deposition layer such that the final thickness of the copper conductor layer was 35 μm, and a 2-layered flexible wiring board was manufactured by using the substrate in the same procedures as in Example 1, a 2-layered flexible wiring board free from pinhole-induced defects in the wiring portion was obtained. Further, when the wiring portion of the obtained 2-layered flexible wiring was peeled off vertically and the adhesion strength of the wiring portion was measured, it was found that the strength was not less than 1 kgf/cm and it had an adhesion strength enough to be served for practical use.

Comparative Example 1

When primary electric copper plating was applied in the same procedures as those in Example 1 except for changing the thickness of the nickel deposition layer formed as the first layer of the underlying metal layer to 40 Å and not forming the second layer of the underlying metal layer, the electrolysis voltage was increased to higher than 10 V and electric current did not flow no more, so that electric copper plating could not be continued.

Comparative Example 2

When a 2-layered flexible substrate was manufactured in the same procedures as those in Example 1 except for changing the thickness of the nickel deposition layer formed as the first layer of the underlying metal layer to 3,000 Å and a 2-layered flexible wiring board was manufactured using the substrate in the same procedures as those in Example 1, a 2-layered flexible wiring board free from pinhole-induced defects in the wiring portion was obtained. However, when the wiring portion of the obtained 2-layered flexible wiring board was peeled off vertically and adhesion strength was measured, the strength was less than 1 kgf/cm, which was insufficient as an adhesion strength to be served for practical use, and Ni was remained between the wirings.

Comparative Example 3

When primary electric copper plating was applied in the same procedures as those in Example 1 except for changing the thickness of the copper deposition layer formed as the second layer of the underlying metal layer to 100 Å, the electrolysis voltage was increased to higher than 10 V and electric current did not flow no more, so that electric copper plating could not be continued.

Comparative Example 4

When a 2-layered flexible substrate was manufactured in the same procedures as those in Example 1 except for changing the thickness of the nickel deposition layer formed as the second layer of the underlying metal layer to 6,000 Å and a 2-layered flexible wiring board was manufactured by using the substrate in the same procedures as those in Example 1, a 2-layered flexible wiring board free from pinhole-induced defects in the wiring portion was obtained. However, when the wiring portion of the obtained 2-layered flexible wiring board was peeled off vertically and adhesion strength was measured, the strength was less than 1 kgf/cm, which was insufficient as an adhesion strength to be served for practical use, and Ni was remained between the wirings.

Comparative Example 5

When the primary electric copper plating was applied in the same procedures as those in Example 1 except for forming a chromium deposition layer of 50 Å thickness as the first layer of the underlying metal layer by vacuum deposition and forming a copper deposition layer of 50 Å thickness as the second layer of the underlying metal layer by vacuum vapor deposition, electrolysis voltage was increased to higher than 10 V and electric current did not flow no more, so that electric copper plating could not be continued.

Comparative Example 6

When a 2-layered flexible substrate was manufactured in the same procedures as those in Example 1 except for forming a copper-nickel deposition layer of 3,000 Å thickness instead of the nickel deposition layer by vacuum deposition and a 2-layered flexible wiring board was manufactured by using the substrate in the same procedures as those in Example 1, a 2-layered flexible wiring board free from pinhole-induced defects in the wiring portion was obtained. However, when the wiring portion of the obtained 2-layered flexible wiring board was peeled off vertically and adhesion strength was measured, the strength was less than 1 kgf/cm, which was insufficient as an adhesion strength to be served for practical use, and Ni was remained between the wirings.

Comparative Example 7

When a 2-layered flexible substrate was manufactured in the same procedures as those in Example 1 except for forming the primary electric copper plated deposition layer to a thickness of 0.1 μm and a 2-layered flexible wiring board was manufactured by using the substrate in the same procedures as those in Example 1, a 2-layered flexible wiring board free from pinhole-induced defects in the wiring portion was obtained. However, when the wiring portion of the obtained 2-layered flexible wiring board was peeled off vertically and adhesion strength was measured, the strength was less than 1 kgf/cm, which was insufficient as an adhesion strength to be served for practical use, and Ni was remained between the wirings.

Comparative Example 8

When a 2-layered flexible substrate was manufactured in the same procedures as those in Example 1 except for forming the primary electric copper plated deposition layer to a thickness of 12 μm and making the final thickness of the conductor layer obtained by applying the secondary electric copper plated deposition layer to 15 μm, and a 2-layered flexible wiring board was manufactured by using the substrate in the same procedures as those in Example 1, a 2-layered flexible wiring board free from pinhole-induced defects in the wiring portion was obtained. However, in the thus obtained 2-layered flexible wiring board, the thickness of the copper conductor layer was thin at a portion considered to be an exposed portion of the polyimide film caused by large pinholes upon forming the underlying metal layer, and a step as large as 12 μm was present relative to other portions, so that it was found that the board was not suitable to the flexible wiring board.

Comparative Example 9

A 2-layered flexible substrate was manufactured in the same procedures as those in Example 1 except for changing the thickness of the primary electric copper plated deposition layer to 10 μm and the thickness of the electroless copper plated deposition layer to 1.0 μm but forming the secondary electric copper plated deposition layer such that the final thickness of the copper conductor layer was 40 μm, and a 2-layered flexible wiring board was manufactured by using the substrate in the same procedures as those in Example 1. As a result, side etching was increased and the wirings were not formed.

Comparative Example 10

A 2-layered flexible substrate was manufactured in the same procedures as those in Example 1 except for using an aqueous solution of potassium hydroxide at a concentration of 0.01 mol/liter for the hydrophilic treatment of an exposed portion of the polyimide film. When presence or absence of pinhole-induced defects was confirmed by applying a light to the obtained substrate on the side of the copper conductor, permeation of light was partially recognized in a region of 12 cm×12 cm area and the presence of pinhole-induced defects was found. When a 2-layered flexible wiring board was manufactured by using the substrate in the same procedures as those in Example 1, it was recognized that failed portions considered to be pinhole-induced defects was present in the wiring portion and it was found that the substrate was not suitable to the manufacture of the 2-layered flexible wiring board having the wiring portion of a narrow pitch width.

Comparative Example 11

A 2-layered flexible substrate was manufactured in the same procedures as those in Example 1 except for using a mixed solution of an aqueous solution of potassium hydroxide at a concentration of 0.01 mol/liter and a hydrazine solution at a concentration of 0.3 mol/liter for the hydrophilic treatment of an exposed portion of the polyimide film. When presence or absence of pinhole-induced defects was confirmed by applying a light to the obtained substrate on the side of the copper conductor, permeation of light was partially recognized in a region of 12 cm×12 cm area and presence of pinhole-induced defects was found. When a 2-layered flexible wiring board was manufactured by using the substrate in the same procedures as those in Example 1, it was recognized that failed portions considered to be pinhole-induced defects was present in the wiring portion and it was found that the substrate was not suitable to the manufacture of the 2-layered flexible wiring board having the wiring portion of a narrow pitch width.

Comparative Example 12

A 2-layered flexible substrate was manufactured in the same procedures as those in Example 1 except for using a mixed solution of hydrazine solution at a concentration of 0.1 mol/liter and an ethylene diamine solution at a concentration of 0.1 mol/liter for the a hydrophilic treatment of an exposed portion of the polyimide film. When presence or absence of pinhole-induced defects was confirmed by applying a light to the obtained substrate on the side of the copper conductor, permeation of light was partially recognized in a region of 12 cm×12 cm area and presence of pinhole-induced defects was found. When a 2-layered flexible wiring board was manufactured by using the substrate in the same procedures as those in Example 1, it was recognized that failed portions considered to be pinhole-induced defects was present in the wiring portion and it was found that the substrate was not suitable to the manufacture of the 2-layered flexible wiring board having the wiring portion of a narrow pitch width.

Comparative Example 13

A 2-layered flexible substrate was manufactured in the same procedures as those in Example 1 except for saving the hydrophilic treatment for an exposed portion of the polyimide film. When presence or absence of pinhole-induced defects was confirmed by applying a light to the obtained substrate on the side of the copper conductor, permeation of light was partially recognized in a region of 12 cm×12 cm area and presence of pinhole-induced defects was found. When a 2-layered flexible wiring board was manufactured by using the substrate in the same procedures as those in Example 1, it was recognized that failed portions considered to be pinhole-induced defects was present in the wiring portion and it was found that the substrate was not suitable to the manufacture of the 2-layered flexible wiring board having the wiring portion of a narrow pitch width.

Comparative Example 14

When a 2-layered flexible substrate was manufactured in the same procedures as those in Example 1 except for saving the primary electric copper plating, and a 2-layered flexible wiring board was manufactured by using the substrate in the same procedures as those in Example 1, a 2-layered flexible wiring board free from pinhole-induced defects in the wiring portion was obtained. However, when the wiring portion of the obtained 2-layered flexible wiring board was peeled off vertically and an adhesion strength was measured, the strength was less than 1 kgf/cm and the adhesion strength is insufficient to be served for the practical use.

Comparative Example 15

A 2-layered flexible substrate was manufactured in the same procedures as those in Example 1 except for saving the electroless copper plating. When absence or presence of pinhole-induced defects was confirmed by applying a light to the obtained substrate on the side of the copper conductor, permeation of light was partially recognized in a region of 12 cm×12 cm area and presence of pinhole-induced defects was found. When a 2-layered flexible wiring board was manufactured by using the substrate in the same procedures as those in Example 1, it was recognized that failed portions considered to be pinhole-induced defects was present in the wiring portion and it was found that the substrate was not suitable to the manufacture of the 2-layered flexible wiring board having the wiring portion of a narrow pitch width.

As has been described above, according to the method of manufacturing the 2-layered flexible substrate of the present invention, since degradation of adhesion of the underlying metal layer induced by minute pinholes, among the pinholes caused in the underlying metal layer by the dry plating applied on the insulation film can be suppressed by applying the primary electric copper plating, and occurrence of the depletion of the conductor portion induced by large pinholes can be suppressed by rendering the surface of the substrate completely electroconductive by covering the exposed defects of the insulation film induced by the large pinholes with the electroless copper plating, an intact 2-layered flexible substrate having a copper conductor layer as thin as 1 to 35 μm can be obtained. Accordingly, a highly reliable 2-layered flexible wiring board having high adhesion and defect free wiring portion can be obtained efficiently by using the substrate and the invention can provide a remarkable industrial advantages.

What is claimed is:

1. A method of manufacturing a 2-layered flexible substrate comprises the steps of:
   (a) depositing an underlying metal layer A on an insulation film by a dry plating method, the metal layer comprising at least one material selected from the group consisting of nickel, nickel-copper alloy, chromium and chromium oxide,
   (b) depositing a further underlying metal layer B consisting of copper on said underlying metal layer A by the dry plating method;
   (c) depositing a primary electric copper plating layer on said further underlying metal B to form a substrate;
   (d) treating the surface of the thus-formed substrate with an inorganic alkaline aqueous solution, an organic alkaline solution or a mixture of these solutions;
   (e) depositing an electroless copper plating layer on the entire surface of the thus-treated substrate; and
   (f) depositing a secondary electric copper plating layer on said electroless copper plating layer to form a copper conductive layer having a thickness of 1 to 35 μm.

2. A method of manufacturing a 2-layered flexible substrate as defined in claim 1, wherein in step (a) the underlying metal layer A is deposited to a thickness of 50 to 2,000 Å.

3. A method of manufacturing a 2-layered flexible substrate as defined in claim 1, wherein the underlying metal layer B is deposited to a thickness of 200 to 5,000 Å.

4. A method of manufacturing a 2-layered flexible substrate as defined in claim 1, wherein the dry plating method of step (a) comprises vacuum vapor deposition, sputtering or ion plating.

5. A method of manufacturing a 2-layered flexible substrate as defined in claim 1, wherein the primary electric copper plating layer of step (c) is deposited to a thickness of 0.3 to 10 μm.

6. A method of manufacturing a 2-layered flexible substrate as defined in claim 1, wherein the inorganic alkaline solution of step (d) is at least one alkaline solution selected from the group consisting of an aqueous solution of potassium hydroxide and an aqueous solution of sodium hydoxide.

7. A method of manufacturing a 2-layered flexible substrate as defined in claim 6, wherein the concentration of the aqueous inorganic alkaline solution is from 0.05 to 3.0 mol/liter.

8. A method of manufacturing a 2-layered flexible substrate as defined in claim 1, wherein the organic alkaline solution of step (d) comprises a mixed solution of hydrazine and ethylene diamine.

9. A method of manufacturing a 2-layered flexible substrate as defined in claim 8, wherein the concentrations of hydrazine and ethylene diamine are from 0.5 to 4.0 mol/liter and from 0.5 to 2.0 mol/liter, respectively.

10. A method of manufacturing a 2-layered flexible substrate as defines in claim 1, wherein the mixed solution of the inorganic alkaline solution and the organic alkaline solution of step (d) comprises a mixed solution of at least one inorganic solution selected from the group consisting of an aqueous potassium hydroxide solution and an aqueous sodium hydroxide solution, and a hydrazine solution.

11. A method of manufacturing a 2-layered flexible substrate as defined in claim 10, wherein the concentrations of the aqueous inorganic alkaline solution and the hydrazine solution are from 0.05 to 3.0 mol/liter and from 0.5 to 4.0 mol/liter, respectively.

12. A method of manufacturing a 2-layered flexible substrate as defined in claim 1, wherein the electroless copper plating layer of step (e) is deposited to a thickness of 0.01 to 1.0 μm.

13. A method of manufacturing a 2-layered flexible substrate as defined in claim 1, wherein between steps (d) and (e) a step of catalyzing the electroless copper plating layer.

* * * * *